United States Patent
Hashemi et al.

(10) Patent No.: US 10,840,433 B2
(45) Date of Patent: Nov. 17, 2020

(54) MRAM WITH HIGH-ASPECT RATIO BOTTOM ELECTRODE

(71) Applicant: International Business Machines Corporation, Armonk, NY (US)

(72) Inventors: Pouya Hashemi, White Plains, NY (US); Bruce B. Doris, Slingerlands, NY (US); John A. Ott, Greenwood Lake, NY (US); Nathan P. Marchack, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 16/240,317

(22) Filed: Jan. 4, 2019

(65) Prior Publication Data
US 2020/0220068 A1    Jul. 9, 2020

(51) Int. Cl.
| | | |
|---|---|---|
| H01L 43/00 | (2006.01) | |
| H01L 43/02 | (2006.01) | |
| H01L 27/22 | (2006.01) | |
| H01L 43/12 | (2006.01) | |
| H01L 21/768 | (2006.01) | |

(52) U.S. Cl.
CPC ........ *H01L 43/02* (2013.01); *H01L 21/76885* (2013.01); *H01L 27/222* (2013.01); *H01L 43/12* (2013.01)

(58) Field of Classification Search
CPC . H01L 21/76885; H01L 43/02; H01L 27/222; H01L 43/12
See application file for complete search history.

(56) References Cited

U.S. PATENT DOCUMENTS

| | | | | |
|---|---|---|---|---|
| 5,382,545 | A | * | 1/1995 | Hong ................ H01L 21/76801 257/E21.575 |
| 2016/0087004 | A1 | * | 3/2016 | Sonoda ................. H01L 27/228 257/252 |
| 2018/0012933 | A1 | | 1/2018 | Suh et al. |
| 2018/0248111 | A1 | | 8/2018 | Raghavan et al. |
| 2018/0261759 | A1 | | 9/2018 | Bhosale et al. |
| 2020/0006639 | A1 | * | 1/2020 | Wu ................... H01L 21/28562 |

FOREIGN PATENT DOCUMENTS

WO    2017222723    12/2017

* cited by examiner

*Primary Examiner* — Matthew L Reames
(74) *Attorney, Agent, or Firm* — Scully, Scott, Murphy & Presser, P.C.; Daniel P. Morris, Esq.

(57) ABSTRACT

An ultra-small diameter and a tall bottom electrode for use in magnetic random access memory (MRAM) devices containing a multilayered MTJ pillar is provided. The bottom electrode is formed by depositing a thick bottom electrode layer on a surface of a metallic etch stop layer. The bottom electrode layer is then patterned by lithography and etching to provide a bottom electrode structure. An angled ion beam etch is thereafter used to trim the bottom electrode structure into a bottom electrode having a high aspect ratio (on the order of 10:1 or greater).

20 Claims, 6 Drawing Sheets

MRAM WITH HIGH-ASPECT RATIO BOTTOM ELECTRODE

BACKGROUND

The present application relates to a memory structure and a method of forming the same. More particularly, the present application relates to a memory structure including a magnetic random access memory (MRAM) device embedded in the back-end-of-the-line (BEOL) and containing a bottom electrode that has an ultra-small diameter and a high-aspect ratio as well as a method of forming the same.

MRAM is a non-volatile random access memory technology in which data is stored by magnetic storage elements. These elements are typically formed from two ferromagnetic plates, each of which can hold a magnetization, separated by a thin dielectric layer. One of the two plates is a permanent magnetic set to a particular polarity; the other plate's magnetization can be changed to match that of an external field to store memory. Such a configuration is known as a magnetic tunnel junction (MTJ).

In leading-edge or neuromorphic computing systems, a MTJ pillar is typically embedded within a back-end-of-the-line (BEOL) structure and is present between a bottom electrode and a top electrode. In such computing systems, the size of the bottom electrode plays a significant role on array yield loss due to partial metallic shorts, especially when the MTJ pillar size is reduced to increase switching efficiency. The partial metallic shorts are caused by resputtered metallic particles that form on the MTJ pillar or surroundings during ion beam etching of a MTJ material stack.

An ultra-small diameter and a tall bottom electrode is desired, but resistance and metal fill could be a concern at high aspect ratios, using common electrode etching and fill methods. As such, there is a need for providing an ultra-small diameter and a tall bottom electrode for use in MRAM devices containing a MTJ pillar which avoids the problems associated with prior art methods.

SUMMARY

The present application provides an ultra-small diameter and a tall bottom electrode for use in MRAM devices containing a multilayered MTJ pillar. The bottom electrode is formed by depositing a thick bottom electrode layer on a surface of a metallic etch stop layer. The bottom electrode layer is then patterned by lithography and etching to provide a bottom electrode structure. An angled ion beam etch is thereafter used to trim the bottom electrode structure into a bottom electrode having a high aspect ratio (on the order of 10:1 or greater).

In one aspect of the present application, a memory structure that includes a MRAM device containing a tall bottom electrode having an ultra-small dimension is provided. In one embodiment of the present application, the memory structure includes an electrically conductive structure embedded in an interconnect dielectric material and having rounded features laterally adjacent to a mesa portion. A metal etch stop material portion is located on the mesa portion of the electrically conductive structure, and a bottom electrode having an aspect ratio of 10:1 or greater is located on a surface of the metal etch stop material portion. A multilayered magnetic tunnel junction (MTJ) pillar is located on the bottom electrode, and a top electrode is located on the multilayered MTJ pillar.

In another embodiment, the memory structure includes an array of electrically conductive structures embedded in an interconnect dielectric material, each electrically conductive structure of the array having rounded features laterally adjacent to a mesa portion. A metal etch stop material portion is located on each mesa portion of each of the electrically conductive structures, and a bottom electrode having an aspect ratio of 10:1 or greater is located on a surface of each metal etch stop material portion. A multilayered magnetic tunnel junction (MTJ) pillar is located on each bottom electrode, and a top electrode is located on the multilayered MTJ pillar.

In another aspect of the present application, a method of forming a memory structure that includes a MRAM device containing a tall bottom electrode having an ultra-small dimension is provided. In one embodiment of the present application, the method includes forming a metal etch stop layer on a surface of an interconnect level which includes at least one electrically conductive structure embedded in an interconnect dielectric material. A bottom electrode layer is formed on a physically exposed surface of the metal etch stop layer. Next, the bottom electrode layer is patterned to provide at least one bottom electrode structure located above each electrically conductive structure. Each bottom electrode is trimmed, by ion beam etching, to provide a bottom electrode having an aspect ratio of 10:1 or greater. In accordance with the present application, the ion beam etching also removes physically exposed portions of the metal etch stop layer, and provides rounded features into each of the electrically conductive structures that are embedded in the interconnect dielectric material. Next, a multilayered magnetic tunnel junction (MTJ) pillar and a top electrode are formed above each bottom electrode.

DETAILED DESCRIPTION

Figure 1:
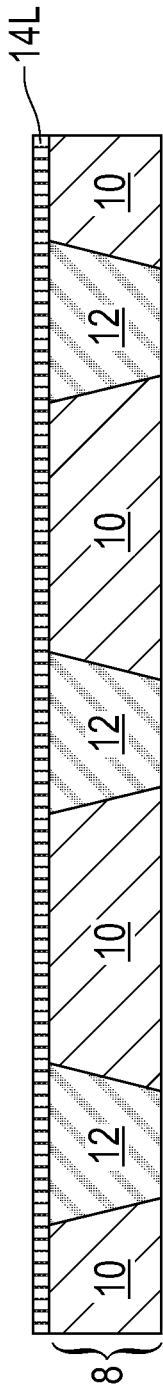
FIG. 1 is a cross sectional view of an exemplary memory structure including a metal etch stop layer located on a surface of an interconnect level which includes at least one electrically conductive structure embedded in an interconnect dielectric material.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary memory structure that can be employed in accordance with an embodiment of the present application. The exemplary memory structure of FIG. 1 includes a metal etch stop layer 14L located on a surface of an interconnect level 8 which includes at least one electrically conductive structure 12 embedded in an interconnect dielectric material 10. In the drawings and in one example, three electrically conductive structures 12 are shown embedded in the interconnect dielectric material 10.

It is noted that the drawings of the present application illustrate a memory device area in which a MRAM device in accordance with the present application will be formed. A non-memory device area may be located laterally adjacent to the memory device area illustrated in the drawings of the present application.

The interconnect dielectric material layer 10 can be composed of any interconnect dielectric material including, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

Each electrically conductive structure 12 is composed of an electrically conductive metal or metal alloy. Examples of electrically conductive materials that may be used in the present application include copper (Cu), aluminum (Al), or tungsten (W), while an example of an electrically conductive metal alloy is a Cu—Al alloy. At this point of the present application, each electrically conductive structure has an entirely planar topmost surface.

In some embodiments, a diffusion barrier liner (not shown) is formed along the sidewalls and a bottom wall of the at least one electrically conductive structure 12. In some embodiments, no diffusion barrier liner is present. The diffusion barrier liner is composed of a diffusion barrier material (i.e., a material that serves as a barrier to prevent a conductive material such as copper from diffusing there through). Examples of diffusion barrier materials that can be used in providing the diffusion barrier liner include, but are not limited to, Ta, TaN, Ti, TiN, Ru, RuN, RuTa, RuTaN, W, or WN. In some embodiments, the diffusion barrier material may include a material stack of diffusion barrier materials. In one example, the diffusion barrier material may be composed of a stack of Ta/TaN.

The interconnect level 8, including the interconnect dielectric material 10, the at least one electrically conductive structure 12, and, if present, the diffusion barrier liner may be formed utilizing conventional processes that are well-known to those skilled in the art. So as to not obscure the method of the present application, the techniques used to form the interconnect level 8 are not provided herein. It is noted that at least one other interconnect level and/or a middle-of-the-line (MOL) level may be located beneath the interconnect level 8. These other levels are not shown for clarity.

After providing the interconnect level 8, the metal etch stop layer 14L is formed on an entirety of the interconnect level 8 including on a physically exposed surface of the interconnect dielectric material 10 and a physically exposed surface of each electrically conductive structure 12. The metal etch stop layer 14L may be composed of Ta, TaN, Ti, TiN, Ru, RuN, RuTa, RuTaN, Co, CoWP, CoN, W, WN or any combination thereof. In one embodiment, the metal etch stop layer 14L is composed of Ru. In the present application, the metal etch stop layer 14L is an ultra-thin layer having a thickness from 2 nm to 10 nm. The metal etch stop layer 14L may be formed by a deposition process such as, for example, sputtering, atomic layer deposition (ALD), chemical vapor deposition (CVD), plasma enhanced chemical vapor deposition (PECVD) or physical vapor deposition (PVD).

Figure 2:
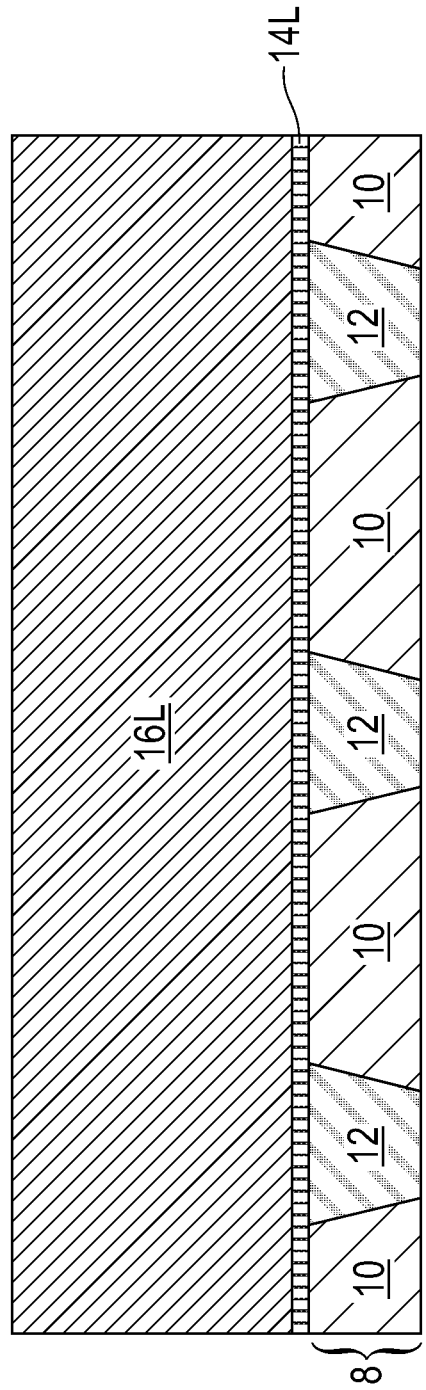
FIG. 2 is a cross sectional view of the exemplary memory structure of FIG. 1 after forming a bottom electrode layer on a physically exposed surface of the metal etch stop layer.

Referring now to FIG. 2, there is illustrated the exemplary memory structure of FIG. 1 after forming a bottom electrode layer 16L on a physically exposed surface of the metal etch stop layer 14L. The bottom electrode layer 16L is composed of Ta, TaN, Ti, TiN, Ru, RuN, RuTa, RuTaN, Co, CoWP, CoN, W, WN or any combination thereof, with the proviso that the bottom electrode layer 16L is compositionally different from the metal etch stop layer 14L. In one embodiment of the present application, the bottom electrode layer 16L is composed of Ti/TiN, while the metal etch stop layer 14L is composed of Ru. In the present application, the bottom electrode layer 16L has a thickness that is from 100 nm to 500 nm. The bottom electrode layer 16L may be formed by a deposition process such as, for example, sputtering, CVD, PECVD or PVD.

Figure 3:
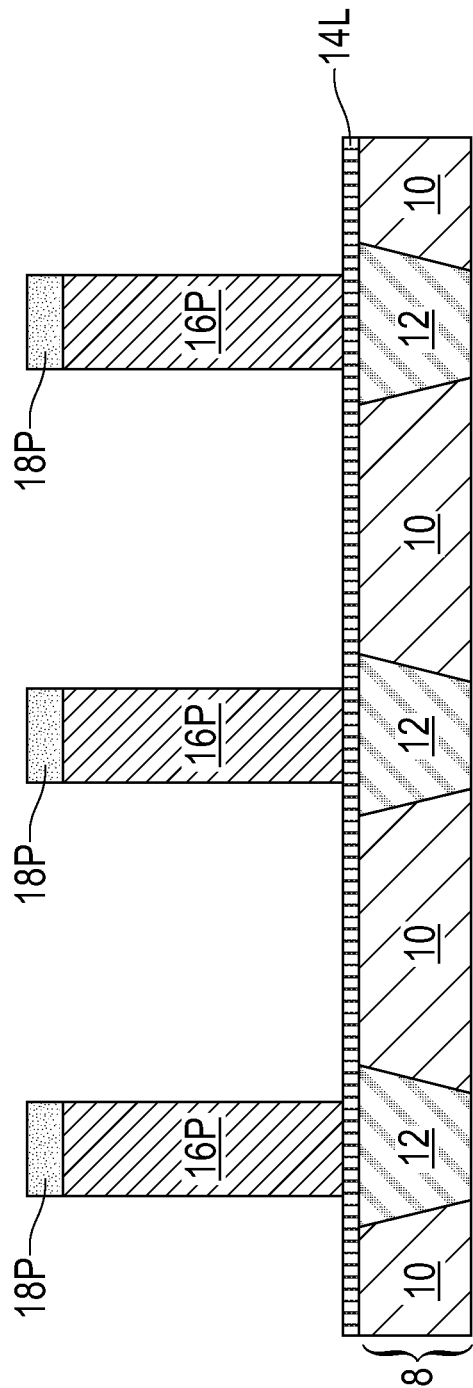
FIG. 3 is a cross sectional view of the exemplary memory structure of FIG. 2 after patterning the bottom electrode layer to provide at least one bottom electrode structure.

Referring now to FIG. 3, there is illustrated the exemplary memory structure of FIG. 2 after patterning the bottom electrode layer 16L to provide at least one bottom electrode structure 16P. Each bottom electrode structure 16P that is formed is located on a surface of the metal etch stop layer 14L and is above an underlying electrically conductive structure 12. Each bottom electrode structure 16P is also capped with a hard mask cap 18P.

The patterning of the bottom electrode layer 16L may include first providing a hard mask layer (not shown) on the physically exposed surface of the bottom electrode layer 16L. The hard mask layer may be composed of any hard mask material such as, for example, silicon dioxide, silicon nitride and/or silicon oxynitride. The hard mask layer may be formed utilizing a deposition process such as, for example, CVD or PECVD. The hard mask layer may have a thickness from 50 nm to 100 nm.

After providing the hard mask layer to the physically exposed surface of the bottom electrode layer 16L, a photolithographic stack (not shown) is then formed on the hard mask layer. The photolithographic stack may include, from bottom to top, a bottom organic layer, a middle inorganic layer and a top resist layer. The bottom organic layer of the photolithographic stack may include an organic planarization layer (OPL). The bottom organic layer can include a spun-on organic layer such as, for example, a Near Frictionless Carbon (NFC), a diamond-like carbon, a thermosetting polyarylene ether or polyimide. The middle inorganic layer can include any oxide layer such as, for example, a low temperature (e.g., less than or equal to 250° C.) CVD oxide, an oxide derived from TEOS (tetraethylorthosilicate), a silicon oxide, a silane oxide, or a Si-containing anti-reflection coating material (SiARC). The top resist layer can be composed of a resist material that provides for high resolution lithography patterning. The photolithographic stack may be formed utilizing a series of deposition processes including first spin-on coating of the bottom organic layer, second spin-on coating of the middle inorganic layer, and third spin-on coating of the top resist layer.

After providing the photolithographic stack, the top resist layer is patterned by photolithography (i.e., exposing the top resist layer to a pattern of irradiation and then developing the exposed top resist layer), and thereafter the pattern provided to the top resist layer is transferred into the underlying layers of the photolithographic stack, the hard mask layer and the bottom electrode layer 16L. The pattern transfer may include one or more pattern transfer etching processes. The one or more pattern transfer etching processes may include dry etching, wet chemical etching or any combination thereof. In one example, the one or more pattern transfer etching processes includes reactive ion etching. After performing the one or more pattern transfer etching processes, the remaining portions of the photolithographic stack are removed utilizing one or more material removal processes so as to provide the exemplary memory structure illustrated in FIG. 3. The hard mask layer that remains after the one or more pattern transfer etching processes is referred to herein as a hard mask cap 18P, while the bottom electrode layer 16L that remains after the one or more pattern transfer etching processes is referred to herein as a bottom electrode structure 16P. Each bottom electrode structure 16P has a height that is equal to the original thickness of bottom electrode layer 16L. Each bottom electrode structure 16P has a first width which may be from 30 nm to 200 nm.

Figure 4:
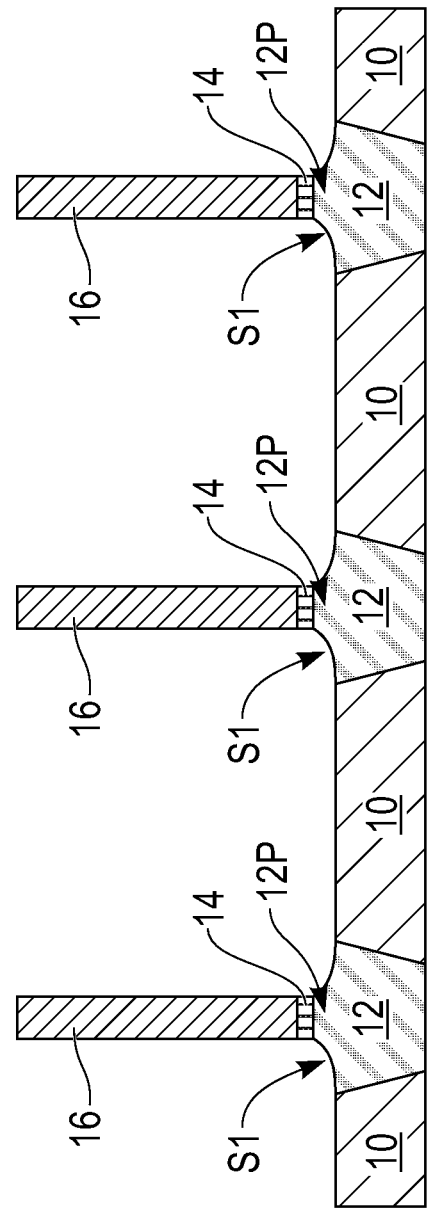
FIG. 4 is a cross sectional view of the exemplary memory structure of FIG. 3 after ion beam etching which trims each bottom electrode structure into a bottom electrode, and removes physically exposed portions of the metal etch stop layer.

Referring now to FIG. 4, there is illustrated the exemplary memory structure of FIG. 3 after ion beam etching which trims each bottom electrode structure 16P into a bottom electrode 16, and removes physically exposed portions of the metal etch stop layer 14L. The ion beam etching that is employed also removes each hard mask cap 18P and an upper portion of the interconnect dielectric material 10, and provides rounded features, S1, to each electrically conductive structure 12. The rounded features, S1, are located laterally adjacent to a mesa portion 12P of the electrically conductive structure 12. The mesa portion 12P has a planar surface.

The ion beam etching that is employed in the present application is performed at an angle that is substantially parallel to the topmost surface of the interconnect dielectric material layer 10. In one embodiment, the ion beam etching that is employed in the present application is performed at an angle from 45° to 89°.

Each bottom electrode 16 that is formed has a height that is equal to the original thickness of the bottom electrode layer 16L. Each bottom electrode 16 that is formed has a second width, that is less than the first width of each bottom electrode structure 16P. In one embodiment, the second width of each bottom electrode 16 is from 5 nm to 25 nm. Hence, each bottom electrode 16 that is formed is tall, and has an ultra-small diameter (i.e., the second width). Each bottom electrode 16 that is formed thus can be referred to herein as a high aspect ratio bottom electrode. By 'high aspect ratio' it is meant that each bottom electrode 16 has width to height ratio of 10:1 or greater.

Each bottom electrode 16 is located on a remaining portion of the metal etch stop layer 14L. The remaining portion of the metal etch stop layer 14L may be referred to a metal etch stop material portion 14. Each metal etch stop material portion 14 has a height that is equal to the original thickness of the metal etch stop layer 14L, and a width that is substantially the same (within ±10%) as the second width of each bottom electrode 16.

Figure 5:
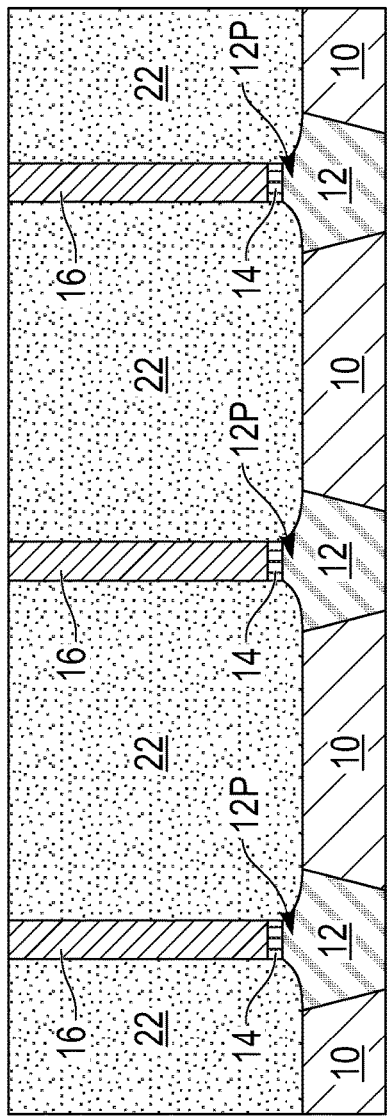
FIG. 5 is a cross sectional view of the exemplary memory structure of FIG. 4 after forming a dielectric material laterally surrounding, and directly contacting, each bottom electrode and remaining portions of the metal etch stop layer.

Referring now to FIG. 5, there is illustrated the exemplary memory structure of FIG. 4 after forming a dielectric material 22 laterally surrounding, and directly contacting, each bottom electrode 16 and remaining portions of the metal etch stop layer (i.e., each metal etch stop material portion 14). The dielectric material 22 also directly contacts the rounded features, S1, provided to each electrically conductor structure 12 and well as a physically exposed surface of the interconnect dielectric material 10. The dielectric material 22 has a topmost surface that is coplanar with a topmost surface of each bottom electrode 16.

The dielectric material 22 may be composed of silicon nitride, silicon dioxide, silicon oxynitride, silicon boron carbon nitride or any other dielectric material or dielectric material stack. The dielectric material 22 may be formed by a low temperature (450° C. or below) deposition process including CVD or PECVD. Following deposition of the dielectric material 22, the dielectric material 22 may be planarized utilizing a conventional planarization process such as, for example, chemical mechanical polishing, so as to provide the exemplary structure shown in FIG. 5.

Figure 6:
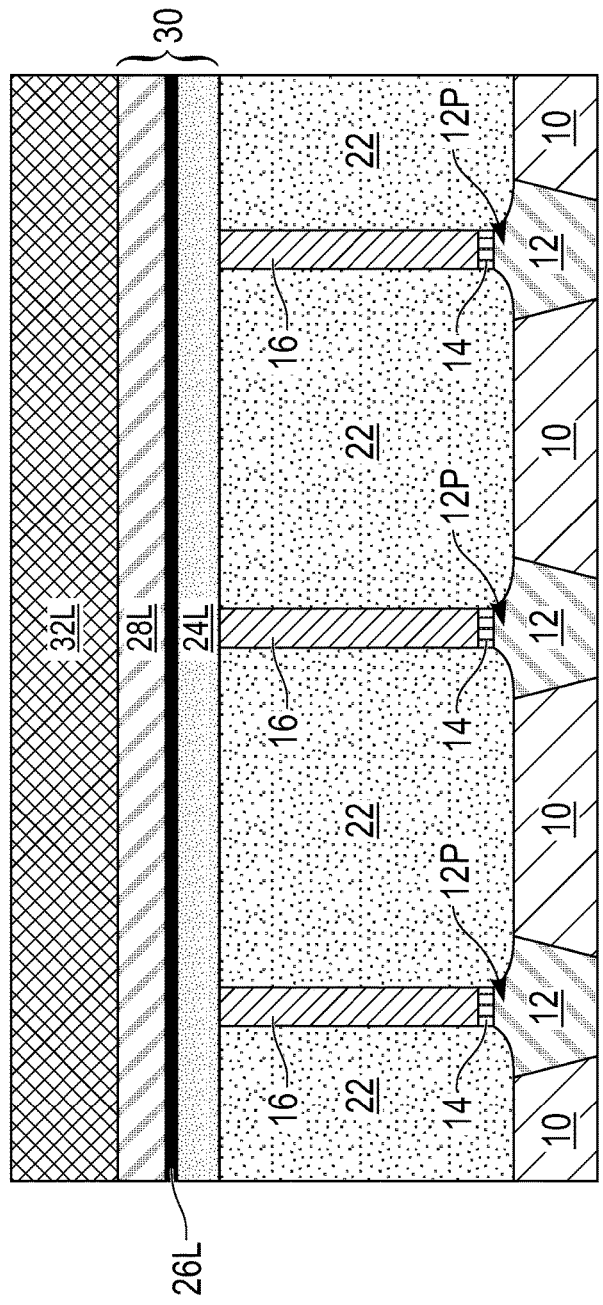
FIG. 6 is a cross sectional view of the exemplary memory structure of FIG. 5 after forming a multilayered magnetic tunnel junction (MTJ) stack and a top electrode layer.

Referring now to FIG. 6, there is illustrated the exemplary memory structure of FIG. 5 after forming a multilayered magnetic tunnel junction (MTJ) stack 30 and a top electrode layer 32L. In one embodiment, the multilayered MTJ stack 30 may include a magnetic reference layer (that may include one or more magnetic reference materials) 24L, a tunnel barrier layer 28L, and a magnetic free layer (that may include one or more magnetic reference materials) 28L.

The magnetic reference layer 24L has a fixed magnetization. The magnetic reference layer 24L may be composed of a metal or metal alloy that includes one or more metals exhibiting high spin polarization. In alternative embodiments, exemplary metals for the formation of the magnetic reference layer include iron, nickel, cobalt, chromium, boron, or manganese.

Exemplary metal alloys may include the metals exemplified by the above. In another embodiment, the magnetic reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier layer 26L is composed of an insulator material and is formed at such a thickness as to provide an appropriate tunneling resistance. Exemplary materials for the tunnel barrier layer 26L include magnesium oxide, aluminum oxide, and titanium oxide, or materials of higher electrical tunnel conductance, such as semiconductors or low-bandgap insulators.

The magnetic free layer 28L is composed of a magnetic material with a magnetization that can be changed in orientation relative to the magnetization orientation of the magnetic reference layer 24L. Exemplary materials for the magnetic free layer 28L include alloys and/or multilayers of cobalt, iron, alloys of cobalt-iron, nickel, alloys of nickel-iron, and alloys of cobalt-iron-boron.

In some embodiment, the multilayered MTJ stack 30 may also include a MTJ cap layer (not shown) located on the magnetic free layer 28L. When present, the MTJ cap layer can be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap layer may have a thickness from 2 nm to 25 nm; other thicknesses are possible and can be used in the present application as the thickness of the MTJ cap layer.

The multilayered MTJ stack 30 may be formed by blanket depositing layers of the various materials that provide the multilayered MTJ stack 30. The depositing can include CVD, PECVD, ALD, PVD, sputtering, or plating.

The top electrode layer 32L may be composed of one of the conductive materials mentioned above for the bottom electrode layer 16L. The conductive material that provides the top electrode layer 32L is typically compositionally different from the MTJ cap layer. The top electrode layer 32L can have a thickness from 50 nm to 200 nm. The top electrode layer 32L may be formed utilizing one of the deposition processes mentioned above in providing the bottom electrode layer 16L.

Figure 7:
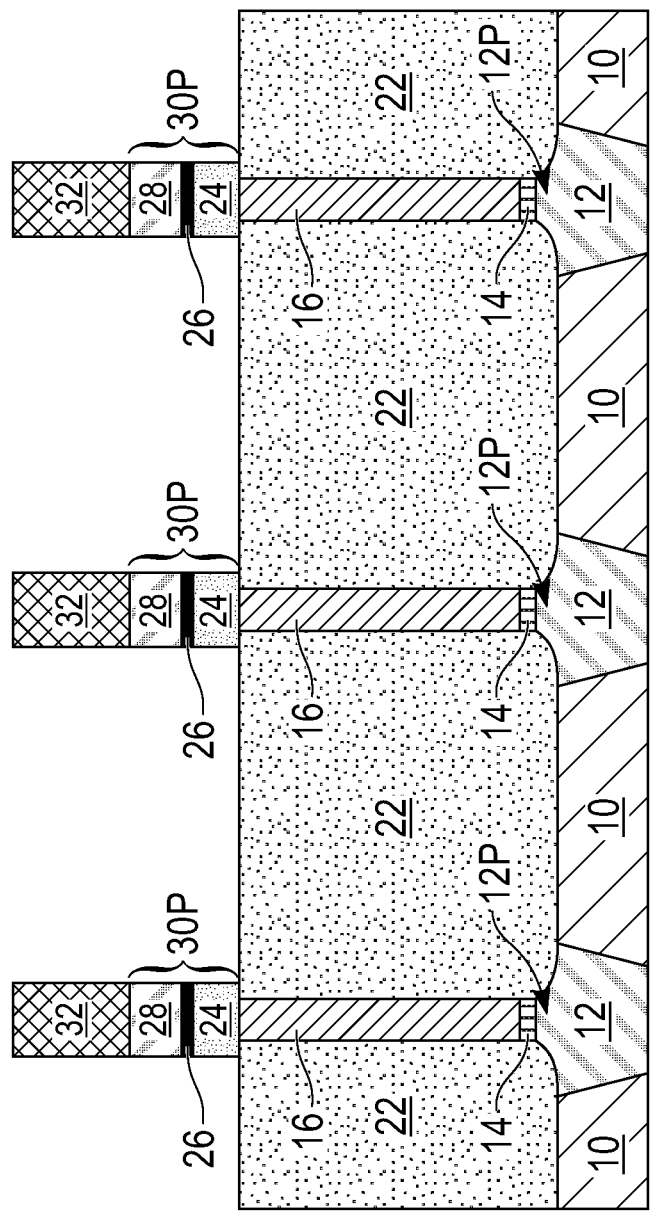
FIG. 7 is a cross sectional view of the exemplary memory structure of FIG. 6 after patterning the top electrode layer and the multilayered MTJ stack to provide a top electrode and a multilayered MTJ pillar, respectively, on each bottom electrode.

Referring now to FIG. 7, there is illustrated the exemplary memory structure of FIG. 6 after patterning the top electrode layer 32L and the multilayered MTJ stack 30 to provide a top electrode 32 and a multilayered MTJ pillar 30P, respectively, on each bottom electrode 16. Top electrode 32 includes a remaining, i.e., non-removed, portion of the top electrode layer 32L, while the multilayered MTJ pillar 30P includes a remaining, i.e., non-removed, portion of the multilayered MTJ stack 30. The multilayered MTJ pillar 30P may include a remaining portion of the magnetic reference layer (hereinafter magnetic reference material portion 24), a remaining portion of the tunnel barrier layer (hereinafter tunnel barrier material portion 28), and a remaining portion of the magnetic free layer (hereinafter magnetic free layer material portion 28). The multilayered MTJ pillar 30P may also include a remaining portion of the MTJ cap layer (hereinafter MTJ cap material portion).

The patterning of the top electrode layer 32L and the multilayered MTJ stack 30 may be performed by photolithography and etching. The photolithographic step includes forming a photoresist material on the material or materials that need to be patterned, exposing the photoresist material to a pattern of irradiation and developing the exposed photoresist material. The etching may include one of the transfer etching steps mentioned above.

The top electrode 32 and the multilayered MTJ pillar 30P have a third width that is typically greater than the second width of the bottom electrode 16. In one embodiment, the third width of the top electrode layer 32 and the multilayered MTJ pillar 30P is typically from 20 nm to 100 nm. Collectively, the top electrode 32, the multilayered MTJ pillar 30P and the bottom electrode 16 provide a MRAM device. FIG. 7 shows an array of MRAM devices.

The top electrode 32, the multilayered MTJ pillar 30P and the bottom electrode 16 may be cylindrical in shape; although other asymmetric shapes are possible and can be formed in the present application.

Notably, FIG. 7 (and the remaining drawings) illustrates a memory structure in accordance with an embodiment of the present application. The memory structure includes an electrically conductive structure 12 embedded in an interconnect dielectric material 10 and having rounded features, S1, laterally adjacent to a mesa portion 12P. A metal etch stop material portion 14 is located on the mesa portion 12P of the electrically conductive structure 12, and a bottom electrode 16 having an aspect ratio of 10:1 or greater is located on a surface of the metal etch stop material portion 14. A multilayered magnetic tunnel junction (MTJ) pillar 30P is located on the bottom electrode 16, and a top electrode 32 is located on the multilayered MTJ pillar 30P.

Figure 8:
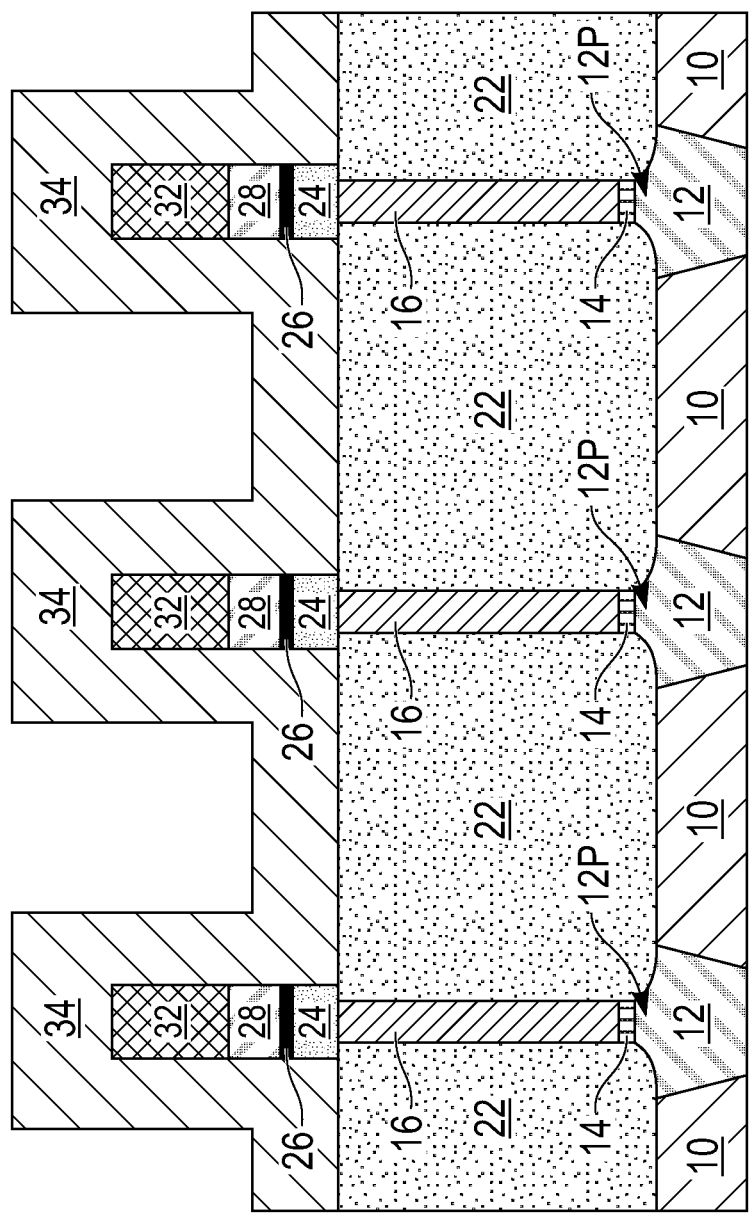
FIG. 8 is a cross sectional view of the exemplary memory structure of FIG. 7 after forming a passivation layer.

Referring now to FIG. 8, there is illustrated the exemplary memory structure of FIG. 7 after forming a passivation layer 34. The passivation layer 34 is formed on physically exposed surfaces of each top electrode 32, each multilayered MTJ pillar 30P and the dielectric material 22. The passivation layer 34 is composed of a dielectric material. In one embodiment, the passivation layer 34 is composed of silicon nitride or aluminum oxide. In another embodiment, the passivation layer 34 may be composed of a dielectric material that contains atoms of silicon, carbon and hydrogen. In some embodiments, and in addition to atoms of carbon and hydrogen, the dielectric material may include atoms of at least one of nitrogen and oxygen. In other embodiments, and in addition to atoms of silicon, nitrogen, carbon and hydrogen, the dielectric material may include atoms of boron. In one example, the passivation layer 34 may be composed of an nBLOK dielectric material that contains atoms of silicon, carbon, hydrogen, nitrogen and oxygen. In alternative example, the passivation layer 34 may be composed of a SiBCN dielectric material that contains atoms of silicon, boron, carbon, hydrogen, and nitrogen.

The passivation layer 34 can be formed utilizing a deposition process such as, for example, CVD, PECVD, PVD, or ALD. The passivation layer 34 may have a thickness from 10 nm to 200 nm. Other thicknesses are possible and can be employed as the thickness of the passivation layer 34.

Figure 9:
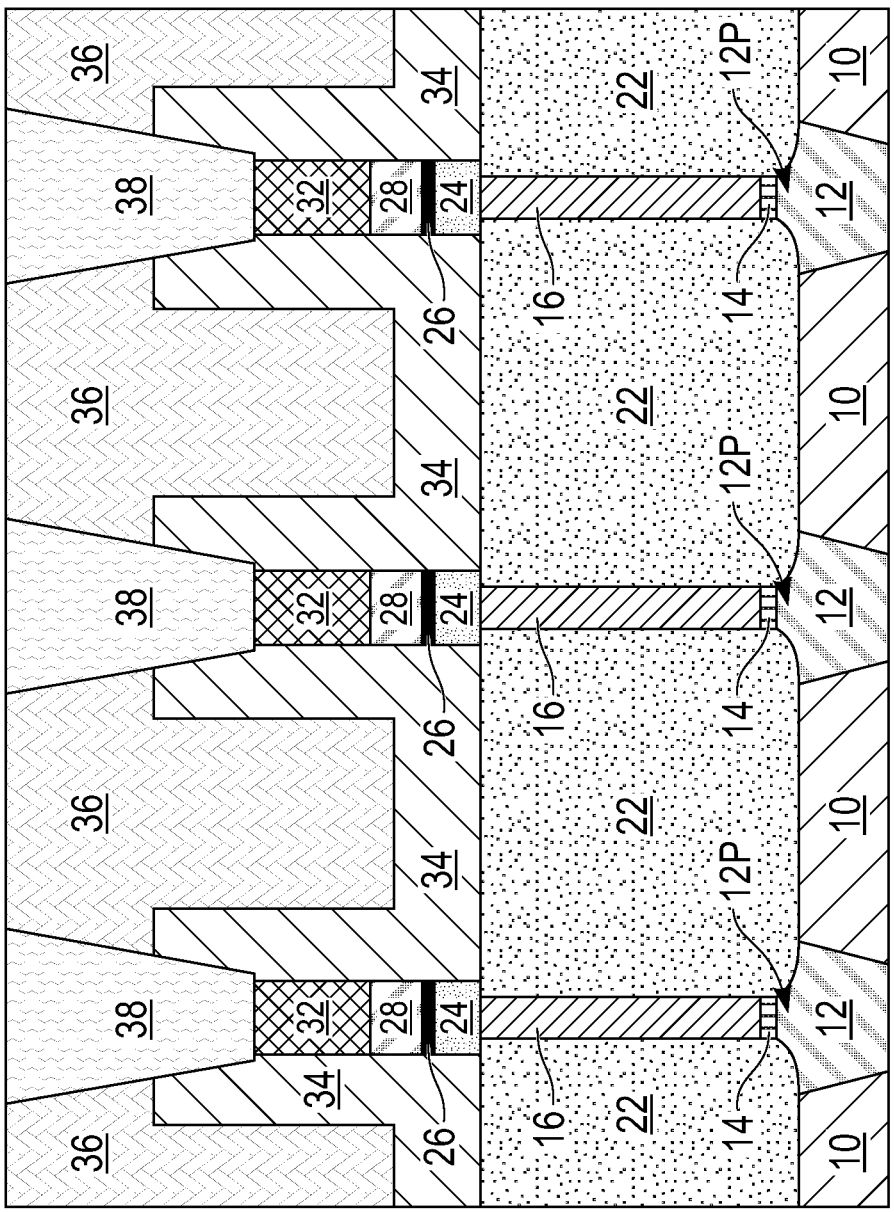
FIG. 9 is a cross sectional view of the exemplary memory structure of FIG. 8 after forming a contact structure embedded in another interconnect dielectric material and contacting a surface of the top electrode of each MRAM device.

Referring now to FIG. 9, there is illustrated the exemplary memory structure of FIG. 8 after forming a contact structure 38 embedded in another interconnect dielectric material 36 and contacting a surface of the top electrode 32 of each MRAM device. The another interconnect dielectric material layer 36 may include one of the dielectric materials mentioned above for the interconnect dielectric material layer 10. In one embodiment, the another interconnect dielectric material layer 36 is composed of a same dielectric material as the interconnect dielectric material 10. In another embodiment, the another interconnect dielectric material layer 36 is composed of a different dielectric material than the interconnect dielectric material 10. The another interconnect dielectric material layer 36 may be formed by utilizing one of the deposition processes mentioned above in forming the interconnect dielectric material 10.

An opening is then formed into an upper portion of the another interconnect dielectric material layer 36 and the passsivation layer 34 to physically expose a surface of top electrode 32. The opening can be formed by lithography and etching. During the etching, the passivation layer 34 that is present on the top electrode 32 is removed; passivation material remains on the sidewalls of the multilayered MTJ pillar 30P and the top electrode 32.

A diffusion barrier material liner (not shown) and a contact structure 38 are then formed within the opening. The diffusion barrier material liner and the contact structure 38 can be formed by deposition of a diffusion barrier material layer and an electrically conductive metal or metal alloy layer, and then performing a planarization process to remove the diffusion barrier material layer and the electrically conductive metal or metal alloy layer that is present outside the opening and above the topmost surface of the another interconnect dielectric material layer 36. In some embodiments, the diffusion barrier material liner is omitted.

When present, the diffusion barrier material liner may include one of the diffusion barrier materials mentioned above for the diffusion barrier liner that may be present in the interconnect level 8. In one embodiment, diffusion barrier material liner is composed of a same diffusion barrier material as diffusion barrier liner that may be present in the interconnect level 8. In another embodiment, diffusion barrier material liner is composed of a different diffusion barrier material than diffusion barrier liner that may be present in the interconnect level 8. A diffusion barrier material layer that provides the diffusion battier material liner may be deposited utilizing any conventional deposition process.

The contact structure 38 may include one of the electrically conductive metals or metal alloys mentioned above for the electrically conductive structure 12. In one embodiment, the contact structure 38 is composed of a same electrically conductive metal or metal alloy as the electrically conductive structure 12. In another embodiment, the contact structure 38 is composed of a compositionally different electrically conductive metal or metal alloy than the electrically conductive structure 12. The electrically conductive metal or metal alloy that provides the contact structure 38 may be deposited utilizing any conventional deposition process.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A memory structure comprising:
   an electrically conductive structure embedded in an interconnect dielectric material and having rounded features laterally adjacent to a mesa portion;
   a metal etch stop material portion located on the mesa portion of the electrically conductive structure;
   a bottom electrode having an aspect ratio of 10:1 or greater located on a surface of the metal etch stop material portion;
   a multilayered magnetic tunnel junction (MTJ) pillar located on the bottom electrode; and
   a top electrode located on the multilayered MTJ pillar.

2. The memory structure of claim 1, further comprising a dielectric material laterally surrounding, and directly contacting, a sidewall of the bottom electrode, and a sidewall of the metal etch stop material portion, wherein the dielectric material directly contacts each rounded feature of the electrically conductive structure and a surface of the interconnect dielectric material.

3. The memory structure of claim 2, wherein the dielectric material has a topmost surface that is coplanar with a topmost surface of the bottom electrode.

4. The memory structure of claim 1, wherein the multilayered MTJ pillar and the top electrode have a same width that is greater than a width of the bottom electrode.

5. The memory structure of claim 1, wherein the multilayered MTJ pillar comprises a stack of a magnetic reference material portion, a tunnel barrier material portion, and a magnetic free material portion.

6. The memory structure of claim 1, wherein the metal etch stop layer material portion is composed of a compositionally different material than the bottom electrode.

7. The memory structure of claim 1, further comprising a contact structure contacting a surface of the top electrode.

8. The memory structure of claim 7, wherein the contact structure is embedded in another dielectric material.

9. A memory structure comprising:
   an array of electrically conductive structures embedded in an interconnect dielectric material, each electrically conductive structure of the array having rounded features laterally adjacent to a mesa portion;
   a metal etch stop material portion located on the mesa portion of each electrically conductive structure;
   a bottom electrode having an aspect ratio of 10:1 or greater located on a surface of each metal etch stop material portion;
   a multilayered magnetic tunnel junction (MTJ) pillar located on each bottom electrode; and
   a top electrode located on each multilayered MTJ pillar.

10. The memory structure of claim 9, further comprising a dielectric material laterally surrounding, and directly contacting, a sidewall of each bottom electrode, and a sidewall of each metal etch stop material portion, wherein the dielectric material directly contacts the rounded features of each electrically conductive structure of the array and a surface of the interconnect dielectric material.

11. The memory structure of claim 9, further comprising a contact structure contacting a surface of each top electrode, wherein the contact structure is embedded in another dielectric material.

12. A method of forming a memory structure, the method comprising:
   forming a metal etch stop layer on a surface of an interconnect level which includes at least one electrically conductive structure embedded in an interconnect dielectric material;
   forming a bottom electrode layer on a physically exposed surface of the metal etch stop layer;
   patterning the bottom electrode layer to provide at least one bottom electrode structure located above each electrically conductive structure;

trimming, by ion beam etching, each bottom electrode structure to provide a bottom electrode having an aspect ratio of 10:1 or greater, wherein the ion beam etching also removes physically exposed portions of the metal etch stop layer, and provides rounded features into each electrically conductive structure that is embedded in the interconnect dielectric material; and forming a multilayered magnetic tunnel junction (MTJ) pillar and a top electrode above each bottom electrode.

13. The method of claim 12, further comprising forming a dielectric material laterally surrounding, and directly contacting, each bottom electrode and remaining portions of the metal etch stop layer, wherein the forming of the dielectric material is performed after the ion beam etching and prior to forming the multilayered MTJ pillar and the top electrode, and the dielectric material has a topmost surface that is coplanar with a topmost surface of each bottom electrode.

14. The method of claim 12, wherein the ion beam etching is performed at an angle from 45° to 89° relative to a topmost surface of the interconnect dielectric material.

15. The method of claim 12, wherein the bottom electrode layer has a thickness from 100 nm to 500 nm.

16. The method of claim 12, wherein the multilayered MTJ pillar comprises a stack of a magnetic reference material portion, a tunnel barrier material portion, and a magnetic free material portion.

17. The method of claim 13, wherein the forming of the multilayered MTJ pillar and the top electrode comprises:

forming a multilayered MTJ stack above each bottom electrode and on a surface of the dielectric material;

forming a top electrode layer on the multilayered MTJ stack; and patterning the multilayered MTJ material stack and the top electrode layer.

18. The method of claim 12, further comprising forming a contact structure contacting a surface of the top electrode.

19. The method of claim 18, further comprising forming a passivation layer on physically exposed surfaces of the multilayered MTJ pillar and the top electrode prior to the forming of the contact structure.

20. The method of claim 19, wherein the forming the contact structure comprising forming another interconnect dielectric material, providing an opening into the another dielectric material and the passivation layer, and filling the opening with a metal or metal alloy.

* * * * *